(12) United States Patent
Verma et al.

(10) Patent No.: US 6,407,450 B1
(45) Date of Patent: Jun. 18, 2002

(54) SEMICONDUCTOR PACKAGE WITH UNIVERSAL SUBSTRATE FOR ELECTRICALLY INTERFACING WITH DIFFERENT SIZED CHIPS THAT HAVE DIFFERENT LOGIC FUNCTIONS

(75) Inventors: Tarun Verma; Larry Anderson, both of Fremont; Jon Long, Livermore; Bruce Pedersen, San Jose, all of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/615,927

(22) Filed: Jul. 13, 2000

Related U.S. Application Data
(60) Provisional application No. 60/143,974, filed on Jul. 15, 1999.

(51) Int. Cl.[7] .............................................. H01L 23/48
(52) U.S. Cl. ....................... 257/697; 257/701; 257/778; 257/780; 257/784
(58) Field of Search ................................ 257/697, 701, 257/778, 780, 782, 784; 438/108, 125

(56) References Cited

U.S. PATENT DOCUMENTS

| | | | |
|---|---|---|---|
| 4,195,195 A | | 3/1980 | de Miranda et al. |
| 5,378,981 A | * | 1/1995 | Higgins, III |
| 5,399,903 A | | 3/1995 | Rostoker et al. |
| 5,637,920 A | | 6/1997 | Loo |
| 5,696,031 A | * | 12/1997 | Wark |
| 6,008,538 A | * | 12/1999 | Akram et al. |
| 6,048,753 A | * | 4/2000 | Farnworth et al. |

FOREIGN PATENT DOCUMENTS

| | | |
|---|---|---|
| EP | 0 171 232 A2 | 2/1986 |
| GB | 2 115 607 A | 9/1983 |

* cited by examiner

*Primary Examiner*—Keith Christianson
*Assistant Examiner*—Stephen W. Smoot
(74) *Attorney, Agent, or Firm*—Pennie & Edmonds LLP

(57) ABSTRACT

A semiconductor package including a universal substrate with interior pads, peripheral pads, and substrate traces positioned between the interior pads and the peripheral pads. The interior pads are configured for electrical interface with a first semiconductor chip. The peripheral pads are configured for electrical interface with a second semiconductor chip that is larger than the first semiconductor chip. By providing a universal substrate that can accommodate multiple die sizes, package design time and costs can thus be reduced.

21 Claims, 7 Drawing Sheets

SEMICONDUCTOR PACKAGE WITH UNIVERSAL SUBSTRATE FOR ELECTRICALLY INTERFACING WITH DIFFERENT SIZED CHIPS THAT HAVE DIFFERENT LOGIC FUNCTIONS

This application claims priority to the provisional patent application entitled, "Apparatus and Method for Packaging Different Sized Semiconductors on a Common Substrate," Ser. No. 60/143,974, filed Jul. 15, 1999.

BRIEF DESCRIPTION OF THE INVENTION

This invention relates generally to the packaging of semiconductor chips. More particularly, this invention relates to a technique for packaging different sized semiconductor chips on a common substrate.

BACKGROUND OF THE INVENTION

After a semiconductor is designed, a separate package is typically designed to house the semiconductor. The reliance upon a separate package for every semiconductor design leads to expensive and time-consuming package design efforts. Accordingly, it would be highly desirable to reduce package design expenses.

SUMMARY OF THE INVENTION

A semiconductor package includes a universal substrate with interior pads, peripheral pads, and substrate traces positioned between the interior pads and the peripheral pads. The interior pads are configured for electrical interface with a first semiconductor chip. The peripheral pads are configured for electrical interface with a second semiconductor chip that is larger than the first semiconductor chip.

The invention reduces package design expenses by providing a universal package substrate that can receive semiconductor chips of different sizes. Thus, a single package can be used for a variety of devices. Preferably, the substrate connections (e.g., power pins, data pins, control pins, and the like) are universally the same, regardless of the semiconductor that is positioned within the package. The invention reduces time to market by reducing substrate design times, reducing non-recurring expenses, and reducing inventory costs.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
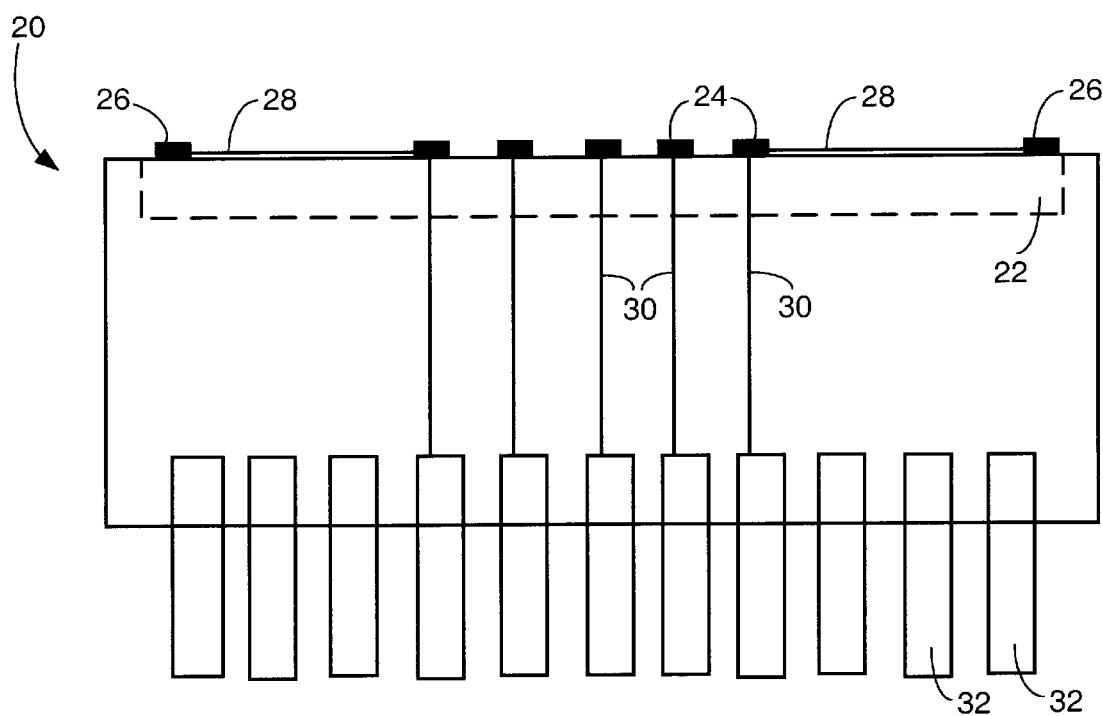
FIG. 1 is a cross-sectional view of a universal semiconductor package constructed in accordance with an embodiment of the invention.

FIG. 1 is a cross-sectional view of a universal semiconductor package 20 constructed in accordance with an embodiment of the invention. The package 20 includes a universal substrate 22, which is used as a single interface to different sized semiconductor chips.

The universal substrate 22 includes interior pads 24, peripheral pads 26 and substrate traces 28 positioned between the interior pads 24 and the peripheral pads 26. Internal package traces 30 link the interior pads 24 (or peripheral pads 26) to a set of package pins 32. For each substrate trace 28 between an interior pad 24 and peripheral pad 26 there is a single internal package trace 30. Thus, a semiconductor is attached to either the interior pad 24 or the peripheral pad 26 associated with a single substrate trace 28.

Figure 2:
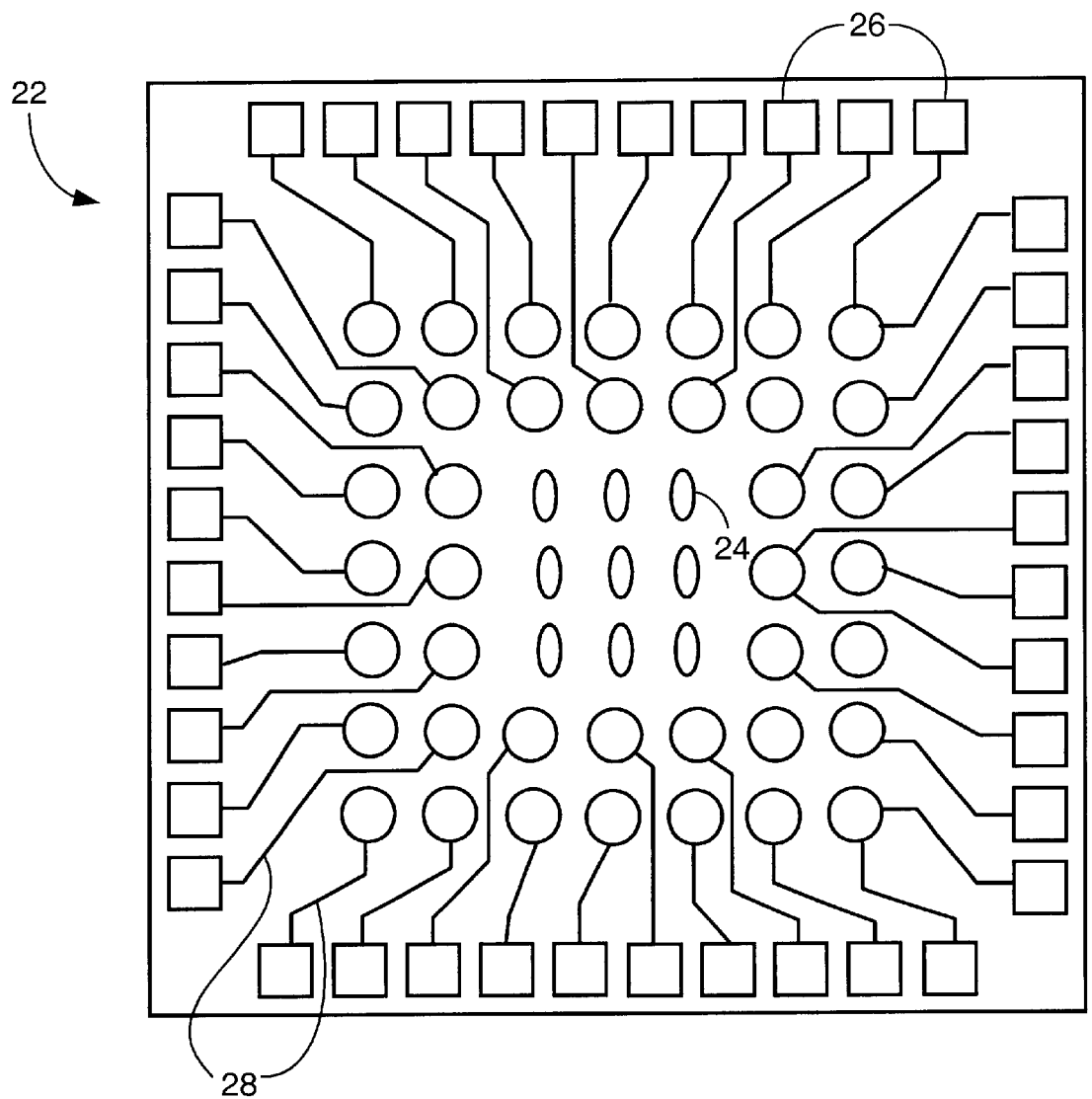
FIG. 2 illustrates a universal substrate used in accordance with an embodiment of the invention.

FIG. 2 is a plan view of the universal substrate 22. The figure illustrates interior pads 24, peripheral pads 26, and a substrate trace 28 positioned between each interior pad 24 and each peripheral pad 26.

Figure 3:
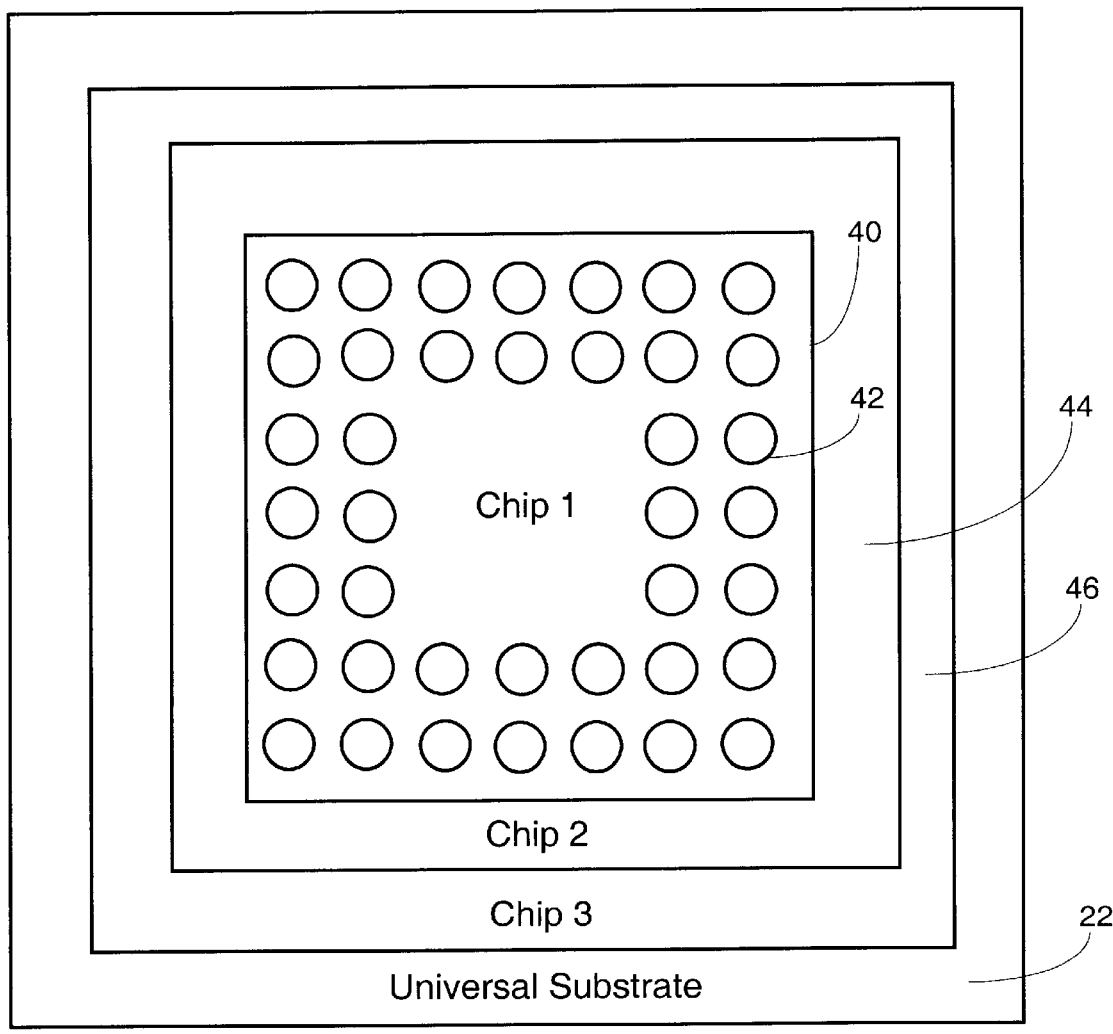
FIG. 3 illustrates how different sized semiconductor chips can be positioned on the universal substrate of the invention.

FIG. 3 is a plan view of the universal substrate 22 showing how it can receive different sized semiconductor chips. In particular, the figure shows a first sized semiconductor chip 40 with flip-chip pads 42. The figure also illustrates a second sized semiconductor chip 44 larger than the first sized semiconductor chip 40, and a third sized semiconductor chip 46 larger than the second sized semiconductor chip 44.

Figure 4:
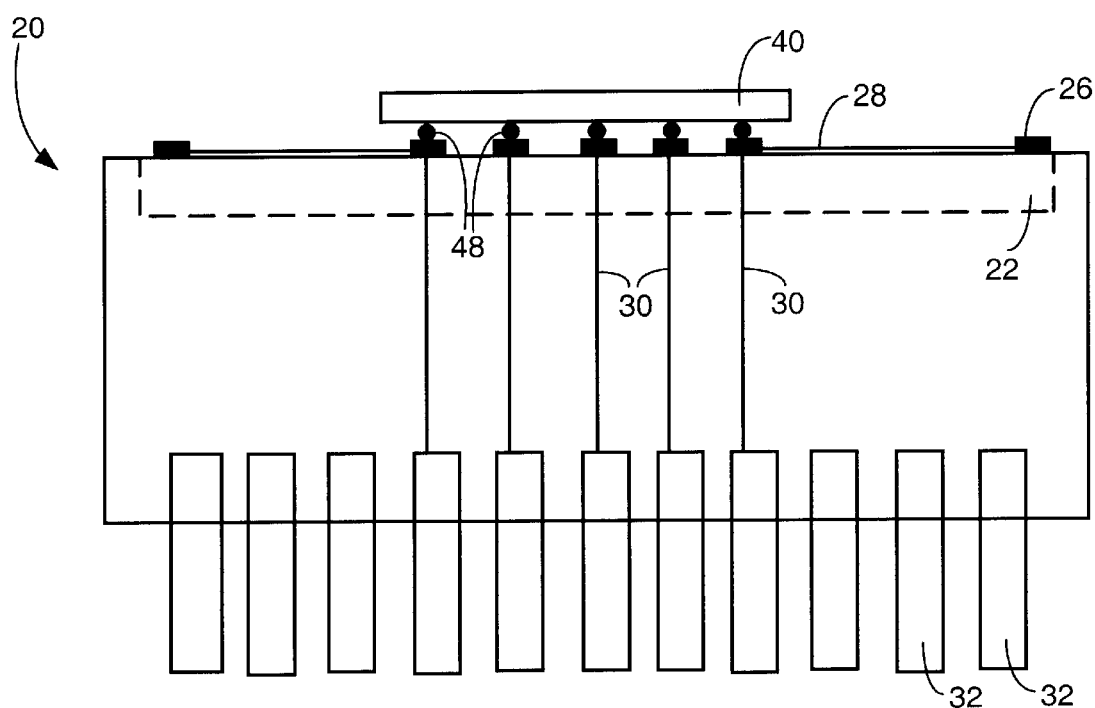
FIG. 4 illustrates the universal semiconductor package of the invention utilized with a semiconductor of a first size.

FIG. 4 is a side view of the first semiconductor chip 40 positioned on the universal substrate 22. The first semiconductor chip 40 is flip-chip attached to the interior pads 24 via bond balls 48.

Figure 5:
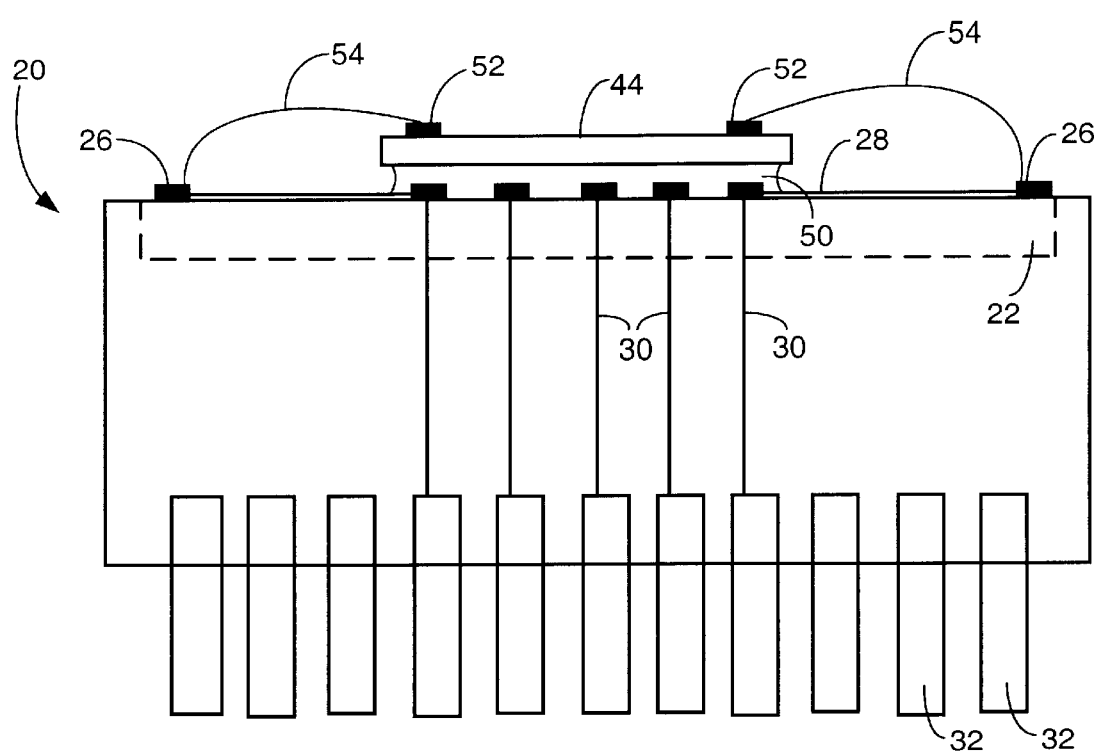
FIG. 5 illustrates the universal semiconductor package of the invention utilized with a semiconductor of a second size.

FIG. 5 is a side view of the second semiconductor chip 44 positioned on the universal substrate 22. The second semiconductor chip 44 is attached via an insulating adhesive 50. Bond pads 52 of the semiconductor chip 44 are attached to the peripheral pads 26 of the substrate 22 via bond wires 54.

Figure 6:
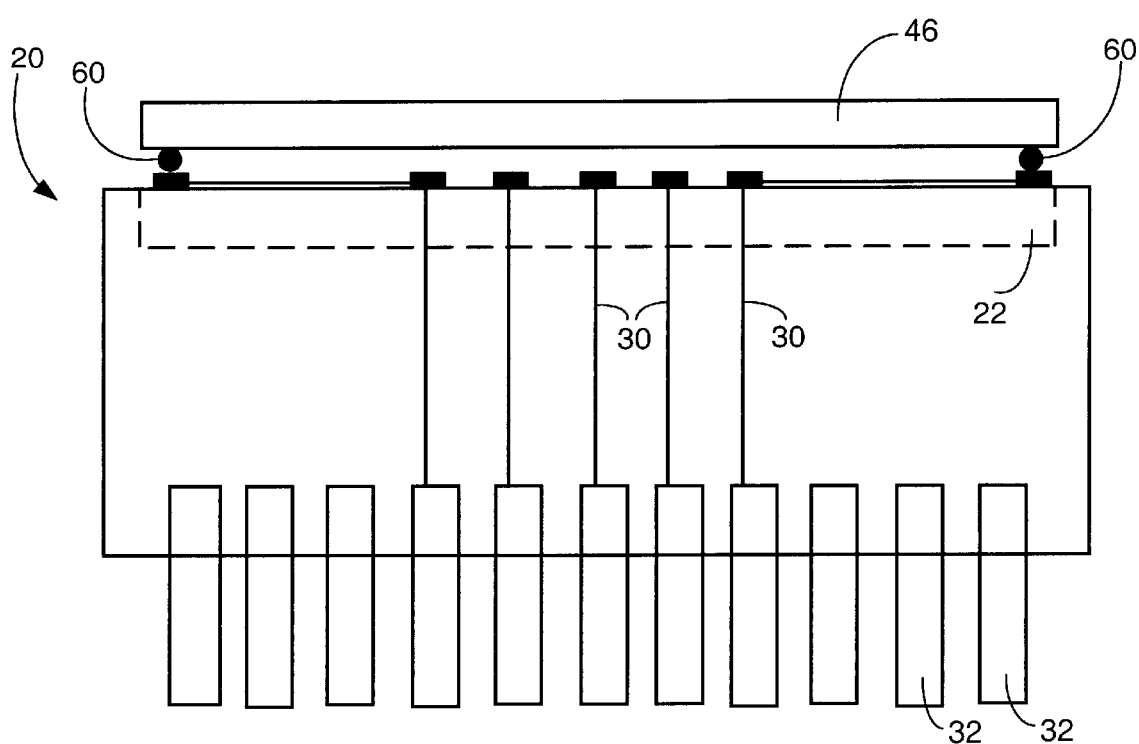
FIG. 6 illustrates the universal semiconductor package of the invention utilized with a semiconductor of a third size.

FIG. 6 is a side view of a third semiconductor chip 46 positioned on the universal substrate 22. The third semiconductor chip 46 is flip-chip attached to the peripheral pads 22 via bond balls 60.

Preferably, the package pins have dedicated signal assignments (e.g., power pin, control pin, I/O pin, and the like) regardless of the type or size of semiconductor chip positioned on the substrate 22. In one embodiment, core connections are arranged in the center of the package with radial connections for power, ground, and expansion of signal lines and associated power of various voltage levels.

The universal substrate 22 may be implemented exclusively for flip-chip connections. The universal substrate 22 may include intermediate pads positioned between the interior pads 24 and the peripheral pads 26.

Figure 7:
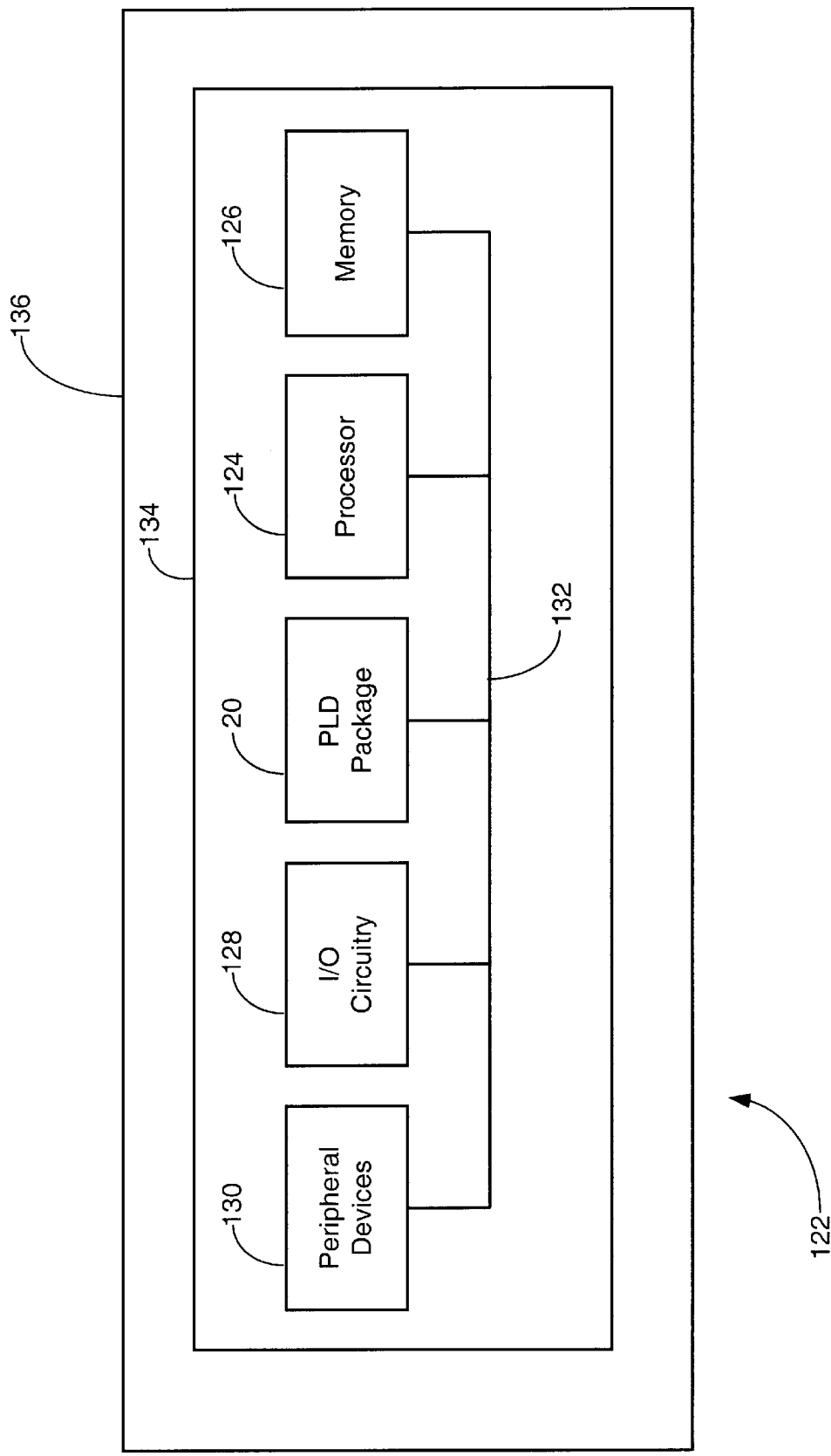
FIG. 7 illustrates the universal semiconductor package of the invention utilized with a programmable logic device that is incorporated into a digital system.

FIG. 7 illustrates a programmable logic device (PLD) positioned within the universal package 20 of the invention. PLDs (sometimes referred to as PALs, PLAs, FPLAs, PLDs, EPLDs, EEPLDs, LCAs, or FPGAs) are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241,224 and 4,871,930, and the Altera Data Book, June 1996, all incorporated herein by reference. The latter are described in, for example, U.S. Pat. Nos. 5,258,668; 5,260,610; 5,260,611; and 5,436,575, and the Altera Data Book, June 1996, all incorporated herein by reference.

The PLD within package 20 forms a part of a data processing system 122. The data processing system 122 may include one or more of the following components: a processor 124, a memory 126, input/output circuitry 128, and peripheral devices 130. These components are coupled together by a system bus 132 and are populated on a circuit board 134, which is contained in an end-user system 136.

The system 122 can be used in a wide variety of applications, such as computer networking, data networking, instrumentation, video processing, digital signal processing, or any other application where the advantage of using re-programmable logic is desirable. The PLD in the package 20 can be used to perform a variety of logic functions. For example, the PLD can be configured as a processor or controller that works in cooperation with processor 124. The PLD may also be used as an arbiter for arbitrating access to a shared resource in the system 122. In yet another example, the PLD can be configured as an interface between the processor 124 and one of the other components in the system 122.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A semiconductor package, comprising:
    a universal substrate including interior pads, peripheral pads, and substrate traces positioned between said interior pads and said peripheral pads, said interior pads being configured for electrical interface with a first semiconductor chip having a first logic function and said peripheral pads being configured for electrical interface with a second semiconductor chip that is larger than said first semiconductor chip and having a logic function different from the first logic function.

2. The semiconductor package of claim 1, wherein said universal substrate comprises a center portion and a peripheral portion, wherein said interior pads are located on said center portion, and wherein said peripheral pads are located on said peripheral portion.

3. The semiconductor package of claim 1, wherein said universal substrate comprises substrate traces that couple said interior pads to said peripheral pads.

4. The semiconductor package of claim 3, further comprising:
    package pins; and
    internal package traces that couple said interior pads to said package pins.

5. The semiconductor package of claim 1, wherein said interior pads are configured for coupling to flip-chip pads of said first semiconductor chip.

6. The semiconductor package of claim 1, wherein said interior pads are configured for attaching to flip-chip pads of said first semiconductor chip by bond balls.

7. The semiconductor package of claim 1, wherein said peripheral pads are configured for coupling to flip-chip pads of said second semiconductor chip.

8. The semiconductor package of claim 1, wherein said peripheral pads are configured for attaching to flip-chip pads of said second semiconductor chip by bond balls.

9. The semiconductor package of claim 1, wherein said peripheral pads are configured for coupling to bond pads of said second semiconductor chip.

10. The semiconductor package of claim 1, wherein said peripheral pads are configured for attaching to bond pads of said second semiconductor chip by bond wires.

11. The semiconductor package of claim 1 further including package pins connected to the interior pads and having dedicated signal assignments regardless of the logic function of a chip mounted to the substrate.

12. A semiconductor package, comprising:
    a universal substrate configured for electrical interface with one of a plurality of semiconductor chips including a first semiconductor chip having a first programmable logic function and a second semiconductor chip having a second programmable logic function, wherein said second semiconductor chip is larger than said first semiconductor chip.

13. The semiconductor package of claim 12, wherein said universal substrate comprises:
    interior pads positioned on a center portion of said universal substrate, said interior pads being configured for coupling to said first semiconductor chip;
    peripheral pads positioned on a peripheral portion of said universal substrate, said peripheral pads being configured for coupling to said second semiconductor chip; and
    substrate traces for coupling said interior pads to said peripheral pads.

14. The semiconductor package of claim 13, further comprising:
    package pins; and
    internal package traces that couple said package pins to said interior pads.

15. The semiconductor package of claim 13, wherein said interior pads are configured for coupling to flip-chip pads of said first semiconductor chip.

16. The semiconductor package of claim 13, wherein said interior pads are configured for attaching to flip-chip pads of said first semiconductor chip by bond balls.

17. The semiconductor package of claim 13, wherein said peripheral pads are configured for coupling to flip-chip pads of said second semiconductor chip.

18. The semiconductor package of claim 13, wherein said peripheral pads are configured for attaching to flip-chip pads of said second semiconductor chip by bond balls.

19. The semiconductor package of claim 13, wherein said peripheral pads are configured for coupling to bond pads of said second semiconductor chip.

20. The semiconductor package of claim 13, wherein said peripheral pads are configured for attaching to bond pads of said second semiconductor chip by bond wires.

21. The semiconductor package of claim 12 further including a semiconductor mounted to the universal substrate.

* * * * *